United States Patent [19]

Kubota et al.

[11] Patent Number: 5,286,567
[45] Date of Patent: Feb. 15, 1994

[54] PELLICLE FOR PHOTOLITHOGRAPHIC MASK

[75] Inventors: Yoshihiro Kubota; Meguru Kashida; Yoshihiko Nagata; Hitoshi Noguchi, all of Gunma, Japan

[73] Assignee: Shin-Etsu Chemical Co., Ltd., Tokyo, Japan

[21] Appl. No.: 912,792

[22] Filed: Jul. 13, 1992

[30] Foreign Application Priority Data

Jul. 23, 1991 [JP] Japan .................................. 3-206588

[51] Int. Cl.$^5$ .............................................. B32B 27/00
[52] U.S. Cl. ................................................ 428/422
[58] Field of Search ........................ 428/421, 422, 403

[56] References Cited

U.S. PATENT DOCUMENTS

| | | | |
|---|---|---|---|
| 4,212,918 | 7/1980 | Marquisee | 428/403 |
| 4,759,990 | 7/1988 | Yen | 428/421 |
| 4,970,099 | 11/1990 | Adams et al. | 428/422 X |

*Primary Examiner*—Thomas J. Herbert, Jr.
*Attorney, Agent, or Firm*—McAulay Fisher Nissen Goldberg & Kiel

[57] ABSTRACT

A pellicle for dust-proofing of a photolithographic mask used for patterning in the manufacturing process of semiconductor devices. The drawback due to dust deposition can be greatly decreased in the use of a pellicle made from a fluorocarbon resin which is a copolymer of tetrafluoroethylene and another fluorocarbon monomer capable of introducing a cyclic perfluoroether group into the molecule when the pellicle film is rendered antistatically hydrophilic, for example, by a plasma treatment.

2 Claims, No Drawings

PELLICLE FOR PHOTOLITHOGRAPHIC MASK

BACKGROUND OF THE INVENTION

The present invention relates to a pellicle for a photolithographic mask used for patterning of semiconductor devices. More particularly, the invention relates to a pellicle for covering a photolithographic mask used for patterning on a semiconductor wafer in the manufacturing process of LSIs, VLSIs and the like as well as liquid-crystal display units with an object to prevent dust deposition on the photomask.

It is a well established technology in the manufacturing process of LSIs, VLSIs, liquid-crystal display units and the like that a fine pattern is formed on the surface of a semiconductor silicon wafer or other substrate materials by the techniques of photolithography in which the surface of the substrate is exposed patternwise to light through a photomask bearing the pattern. A serious problem in this process is that the surface of the photomask is sometimes very susceptible to the deposition of dust which is responsible for the degradation of patterning quality such as deformation of the pattern, roughened edge line of the pattern, decrease in the image contrast and so on due to scattering of light by the dust particles.

It is therefore essential that the photolithographic patterning works are conducted in a clean room under circulation of air freed from dust particles as completely as possible although the problem of dust deposition cannot be completely solved even by this means. Accordingly, it is usually practiced that a pellicle, which is a thin film of a polymeric resin highly transparent to light such as nitrocellulose, cellulose acetate and the like, is applied to the surface of the photomask to prevent dust deposition thereon.

A pellicle formed from the above mentioned cellulose derivatives, however, has several problems and disadvantages. For example, the polymer is not highly transparent in the ultraviolet region of light used for the pattern-wise exposure having a relatively strong absorption in the short wavelength region of 210 to 400 nm. Moreover, the cellulose derivatives are rather unstable against irradiation with ultraviolet light so that yellowing occurs and cracks are eventually formed in the pellicle after a certain period of use. Therefore, pellicles made from a cellulose derivative are not quite satisfactory for the patterning works using short-wavelength ultraviolet light of so-called i-line or the light emitted from an excimer laser as the light source in fine patterning for the manufacture of VLSIs and very finely patterned liquid-crystal display units.

Besides the above mentioned cellulose derivatives as the material of the pellicle for a photolithographic mask, a proposal is made in Japanese Patent Kokai 60-83032 that a pellicle is made from a transparent film of a specific fluorocarbon resin which is a binary copolymer of tetrafluoroethylene and vinylidene fluoride or a ternary copolymer of tetrafluoroethylene, hexafluoropropylene and vinylidene fluoride. Although the pellicle of such a fluorocarbon resin has increased transparency to short-wavelength ultraviolet light at least as prepared, the polymer, which is amorphous and has a linear molecular structure, has a tendency toward subsequent crystallization under irradiation with ultraviolet light forming crystallites which more or less cause scattering of light to gradually decrease the transparency of the pellicle during use.

As a solution for the above mentioned problem of subsequent crystallization in the pellicle made from a fluorocarbon resin, Japanese Patent Kokai 3-39963 proposes a pellicle made from a fluorocarbon resin which is a copolymer of tetrafluoroethylene and a fluorocarbon monomer having a cyclic perfluoro ether group. This fluorocarbon resin is indeed effective in solving the problem of the subsequent crystallization but has another difficult problem that the pellicle of the resin is highly susceptible to the accumulation of electrostatic charges on the surface. Needless to say, dust particles are readily attracted by and deposited on the electrostatically charged surface so that the purpose of the pellicle for preventing dust deposition can no longer be met once the pellicle film is electrostatically charged to attract and cause deposition of dust particles on the pellicle surface.

SUMMARY OF THE INVENTION

The present invention accordingly has an object to provide a novel and improved pellicle for a photolithographic mask free from the above described problems and disadvantages in the prior art pellicles.

Thus, the present invention provides a pellicle for a photolithographic mask, of which at least one of the surfaces is rendered hydrophilic.

In particular, the invention provides a pellicle for a photolithographic mask made from an amorphous fluorocarbon resin of a copolymer of tetrafluoroethylene and a fluorocarbon monomer copolymerizable therewith and capable of introducing a cyclic perfluoro ether group into the molecular structure, of which at least one of the surfaces is rendered hydrophilic.

DETAILED DESCRIPTION OF THE PREFERRED EMBODIMENTS

As is described above, the most characteristic feature of the inventive pellicle is that at least one of the surfaces thereof is rendered hydrophilic so as to be antistatic. The means for rendering the pellicle surface hydrophilic is not particularly limitative including physical and chemical methods. For example, the surface is subjected to a treatment with plasma discharge or corona discharge or irradiated with an excimer laser beam or synchrotron radiation.

The advantage given by the inventive pellicle imparted with hydrophilicity on at least one of the surfaces is particularly great when, though not particularly limitative, the polymeric resin forming the pellicle is an amorphous copolymer of tetrafluoroethylene and a fluorocarbon monomer copolymerizable therewith and introducing cyclic perfluoro ether groups into the molecular structure because resins of this type have high transparency in the ultraviolet region including the g-line light having a wavelength of 436 nm, i-line light having a wavelength of 365 nm and excimer laser emission having a wavelength of 248 nm. In addition, the resin is highly stable against irradiation with ultraviolet light not to cause yellowing or decrease of transparency due to crystallization even after a prolonged use. The polymeric resin forming the inventive pellicle can be selected, besides the above mentioned amorphous copolymer of tetrafluoroethylene and a fluorocarbon monomer copolymerizable therewith to introduce cyclic perfluoro ether groups, from cellulose derivatives such as nitrocellulose and cellulose acetate, binary copolymers of tetrafluoroethylene and vinylidene fluoride and ternary copolymers of tetrafluoroethylene, hexafluoropropylene and vinylidene fluoride.

The above mentioned amorphous perfluorocarbon polymers consist of the monomeric units derived from perfluoroethylene and the monomeric units of the cyclic perfluoro ether structure as expressed, for example, by the formulas:

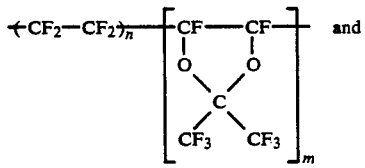
(I)

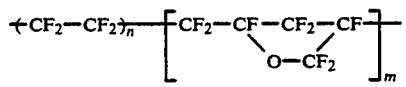
(II)

in which n and m are each a positive integer. These copolymers of the formulas (I) and (II) can be obtained by the copolymerization of tetrafluoroethylene and the monomers expressed by the formulas:

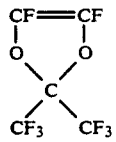
(III)

and

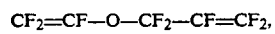
$CF_2=CF-O-CF_2-CF=CF_2$, (IV)

respectively.

The molar proportion of the fluorocarbon monomer of the formula (III) or (IV) to tetrafluoroethylene is preferably in the range from 10:90 to 90:10. The procedure for the copolymerization of the fluorocarbon monomer expressed by the formula (III) with tetrafluoroethylene is performed in the presence of perfluoropropionyl peroxide as the polymerization initiator and 1,1,2-trichloro-1,2,2-trifluoroethane as the solvent according to the procedure described in Japanese Patent Publication 63-18964. A fluorocarbon resin obtained by this method is available as a commercial product (Teflon AF, a product by Du Pont Co.). Alternatively, the procedure for the copolymerization of the fluorocarbon monomer expressed by the formula (IV) with tetrafluoroethylene is described in Japanese Patent Kokai 63-238115. A fluorocarbon resin prepared by this latter method is available as a commercial product (Sitop, a product by Asahi Glaaa Co.).

The above described fluorocarbon resins can be shaped into a film by the solution casting method. For example, the resin is dissolved in a suitable solvent such as perfluoro(2-butyl tetrahydrofuran), perfluoro(2-propyl tetrahydrofuran) and the like in a concentration of 3 to 10% by weight and the solution is uniformly spread over the surface of a substrate by a suitable coating method using a spinner, knife coater and the like. The pellicle film should have a thickness in the range from 0.5 to 10 μm or, preferably, from 0.8 to 5 μm in consideration of the balance between the mechanical strengths and transmission of light. For example, the pellicle film should preferably have a transmission of at least 95% or, more preferably, at least 98% so that the film thickness is controlled to satisfy this requirement. More particularly, a pellicle film having a thickness of 5 μm should desirably have an overall transmission of light of at least 90% in the wavelength region of 210 to 500 nm. The pellicle of the invention is prepared by supporting the above described resin film on a frame made from, for example, an aluminum alloy in a crease-free fashion.

The pellicle film is imparted with hydrophilicity on at least one surface or, preferably, on both surfaces by a suitable method which can be chemical or physical. For example, the pellicle film, either unsupported or frame-supported, is subjected to a plasma discharge treatment or corona discharge treatment in an atmosphere of oxygen, gaseous mixture of oxygen and hydrogen, ammonia and the like so that hydrophilic groups are introduced to the surface. Alternatively, the surface can be irradiated with excimer laser beams or synchrotron radiation. The hydrophilicity of the pellicle surface or hydrophilic surface implied here is defined in such a way that a surface on which the contact angle of a water droplet is 90° or smaller or, preferably, 70° or smaller at room temperature is called a hydrophilic surface. Desirably, the treated surface should be easily wetted with water. In other words, the treatment of the pellicle surface should be conducted until the surface is imparted with such hydrophilicity. It is noted that the transparency of the pellicle film is not decreased by such a hydrophilic treatment. Optionally, the surface of the pellicle film before the hydrophilic treatment is provided with a coating layer of magnesium fluoride, calcium fluoride and the like so that an improvement can be obtained in the transparency of the film to light.

In the following, the pellicle of the invention is illustrated in more detail by way of examples and comparative examples.

EXAMPLE 1

A resin solution in a concentration of 8.0% by weight was prepared by dissolving a fluorocarbon resin (Teflon AF1600, a product by Du Pont Co.) which was a copolymer of tetrafluoroethylene and a fluorocarbon monomer having the cyclic perfluoro ether group expressed by the formula (III) in a molar ratio of 0.34:0.66, in a fluorocarbon solvent (Fluorinert FC-75, a product by Minnesota Mining & Manufacturing Co.), of which the principal ingredient is perfluoro(2-butyl tetrahydrofuran).

The resin solution was dropped on the polished surface of a fused quarts glass disc having a diameter of 200 mm and a thickness of 3 mm and then spread over the surface by using a spinner into a coating layer of a uniform thickness from which a film having a thickness of 1.21 μm was obtained by drying. The dried resin film was peeled off from the substrate surface in water and then dried on a Teflon frame of 150 mm diameter in a vacuum drying oven at 80° C. for 5 hours. The dried resin film was spread over a square frame of aluminum having a 10 cm by 10 cm outside dimensions and 9 cm by 9 cm inside dimensions and adhesively bonded to the frame by using an epoxy-based adhesive in a crease-free fashion to complete a frame-supported pellicle.

The frame-supported pellicle was set in the plasma chamber of a plasma-treatment apparatus, in which the pellicle was exposed for 5 minutes to plasma generated in an atmosphere of 99:1 by volume mixture of argon and oxygen under a pressure of 1.56 Torr by supplying a high-frequency power at a frequency of 13.56 MHz. The contact angle of a water droplet on the thus plasma-treated pellicle surface was 65° at room temperature so that the surface was wet all over when a small volume of water was sprayed thereto while the contact angle of a water droplet on the same pellicle film before the plasma treatment was 110° to exhibit repellency to water droplets.

The frame-supported pellicles after and before the plasma treatment were horizontally kept for 24 hours in a clean room of cleanness 1000 in an atmosphere of 50% relative humidity at 24° C. and then inspected microscopically to count the number of dust particles of 3 μm or larger on the whole surface. The number was only one on the surface of the plasma-treated pellicle while 80 dust particles were found on the surface of the pellicle before the plasma treatment.

The light transmission through the plasma-treated pellicle film was 97.5% for each of the excimer laser beam, i-line light and g-line light at wavelengths of 248 nm, 365 nm and 436 nm, respectively. The pellicle film was continuously irradiated for 1500 hours at room temperature with the i-line light in an energy intensity of 90 watts/cm$^2$ and the light transmission therethrough was again determined for the i-line light to detect absolutely no decrease.

EXAMPLE 2

A resin solution in a concentration of 5.0% by weight was prepared by dissolving a fluorocarbon resin (Sitop, a product by Asahi Glass Co.) which was a copolymer of tetrafluoroethylene and the fluorocarbon monomer expressed by the formula (IV) in a molar ratio of 0.30:0.70, in the same fluorocarbon solvent as used in Example 1.

A resin film was prepared from the above prepared resin solution in the same manner as in Example 1, from which frame-supported pellicles were prepared. One of the frame-supported pellicle films was subjected to an irradiation treatment in an atmosphere of a 1:2 by volume mixture of oxygen and hydrogen under normal pressure by scanning with a KrF excimer laser beam of 600 watts output over a period of 1 hour. The contact angle of a water droplet on the pellicle surface, which was water-repellent before the laser beam treatment, was 62° after the treatment so as to be wet with water sprayed thereto.

The same dust deposition test as in Example 1 was undertaken to find that the number of the deposited dust particles was 3 on the laser beam-treated pellicle film while the number was as large as 124 on the pellicle film before the laser beam treatment.

The light transmission through the laser beam-treated pellicle film was 94.5%, 95.5% and 95.5% for the excimer laser beam, i-line light and g-line light at wavelengths of 248 nm, 365 nm and 436 nm, respectively. The pellicle film was continuously irradiated for 1500 hours at room temperature with the i-line light in an energy intensity of 90 watts/cm$^2$ and the light transmission therethrough was again determined for the i-line light to detect absolutely no decrease.

What is claimed is:

1. A pellicle for a photolithographic mask made from an amorphous fluorocarbon resin which is a copolymer of tetrafluoroethylene and a fluorocarbon monomer copolymerizable therewith and capable of introducing a cyclic perfluoroether into the molecular structure of the copolymer wherein at least one of the surfaces is rendered hydrophilic and has a contact angle of water on the surface not exceeding 90° C. at room temperature.

2. The pellicle for a photolithographic mask as claimed in claim 1 of which at least one of the surfaces is rendered hydrophilic by the irradiation with an excimer laser beam.

* * * * *